United States Patent
Wang et al.

(10) Patent No.: US 7,180,389 B2
(45) Date of Patent: Feb. 20, 2007

(54) EMI FILTER AND FREQUENCY FILTERS HAVING CAPACITOR WITH INDUCTANCE CANCELLATION LOOP

(75) Inventors: Shuo Wang, Blacksburg, VA (US); Fred C. Lee, Blacksburg, VA (US); Williem Gerhardus Odendaal, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 31 days.

(21) Appl. No.: 11/013,930

(22) Filed: Dec. 17, 2004

(65) Prior Publication Data
US 2006/0132257 A1     Jun. 22, 2006

(51) Int. Cl.
*H03H 7/09* (2006.01)

(52) U.S. Cl. .............. 333/181; 333/185; 361/306.2

(58) Field of Classification Search ............... 333/12, 333/177, 181, 185; 361/306.1, 306.2, 306.3, 361/307, 310
See application file for complete search history.

(56) References Cited

U.S. PATENT DOCUMENTS

| | | | | |
|---|---|---|---|---|
| 4,879,631 A | * | 11/1989 | Johnson et al. | 361/684 |
| 5,122,924 A | * | 6/1992 | Okumura | 361/330 |
| 5,179,362 A | * | 1/1993 | Okochi et al. | 333/181 |
| 5,761,049 A | | 6/1998 | Yoshidome et al. | |
| 5,910,879 A | | 6/1999 | Herbert | |
| 6,498,713 B2 | | 12/2002 | Sanger et al. | |

2003/0210110 A1    11/2003    Perreault et al.

FOREIGN PATENT DOCUMENTS

WO     WO 2004049565 A1 *    6/2004

OTHER PUBLICATIONS

Neugebauer, T.C., et al., "Filters and Components with Inductance Cancellation", IEEE Transactions on Industry Applns., vol. 40, No. 2, pp. 483-491 (Mar. 2004).
Neugebauer, T.C., et al., "Filters with Inductance Cancellation Using Printed Circuit Board Transformers", IEEE Transactions on Power Electronics, vol. 19, No. 3, pp. 591-602 (May 2004).

* cited by examiner

*Primary Examiner*—Seungsook Ham
(74) *Attorney, Agent, or Firm*—Whitham, Curtis, Christofferson & Cook, P.C.

(57) ABSTRACT

An electromagnetic interference (EMI) filter or frequency filters (e.g. bandpass or band reject filters) in which a capacitor has an inductance cancellation loop. Inductive coupling between capacitors can allow undesired high frequencies to propagate across a filter. This is particularly a concern when the capacitors are oriented in parallel. In the present invention, the inductance cancellation loop is disposed adjacent to one capacitor so that mutual inductance between the capacitors is reduced. The attenuation of the filter at high frequencies is thereby increased. The loop can increase voltage attenuation of an EMI filter by about 20 dB. In another aspect, inductors in the filter are oriented horizontally relative to a circuitboard. Horizontal orientation reduces leakage inductance coupling between the inductors and circuitboard traces, and between the inductor and capacitors, thereby preventing unwanted propagation of high frequencies. Both measures in combination can provide a voltage attenuation increase of 30 dB.

17 Claims, 9 Drawing Sheets

EMI FILTER AND FREQUENCY FILTERS HAVING CAPACITOR WITH INDUCTANCE CANCELLATION LOOP

This invention was made with the assistance from a grant by the National Science Foundation (EEC-973677), and the U.S. Government may have certain rights in this invention.

FIELD OF THE INVENTION

The present invention relates generally to electromagnetic interference (EMI) filters. More specifically, the present invention relates to an EMI filter with a capacitor having an extra current loop for canceling parasitic inductive coupling between capacitors. With the inductive coupling between capacitors weakened, the EMI filter provides an exceptionally high attenuation.

BACKGROUND OF THE INVENTION

Electromagnetic interference (EMI) filters are commonly used throughout the electronics industry. EMI filters are typically placed on input power lines of electronic equipment so that high frequency electromagnetic noise does not enter or escape the equipment.

It is desirable for EMI filters to attenuate high frequency noise as much as possible. Typically, noise that must be attenuated is in the frequency range of about 10 kilohertz or 150 kilohertz to 30 megahertz. Noise in the frequency range of about 1–30 Mhz is particularly problematic because it can propagate across a circuit board via inductive coupling.

Figure 1:
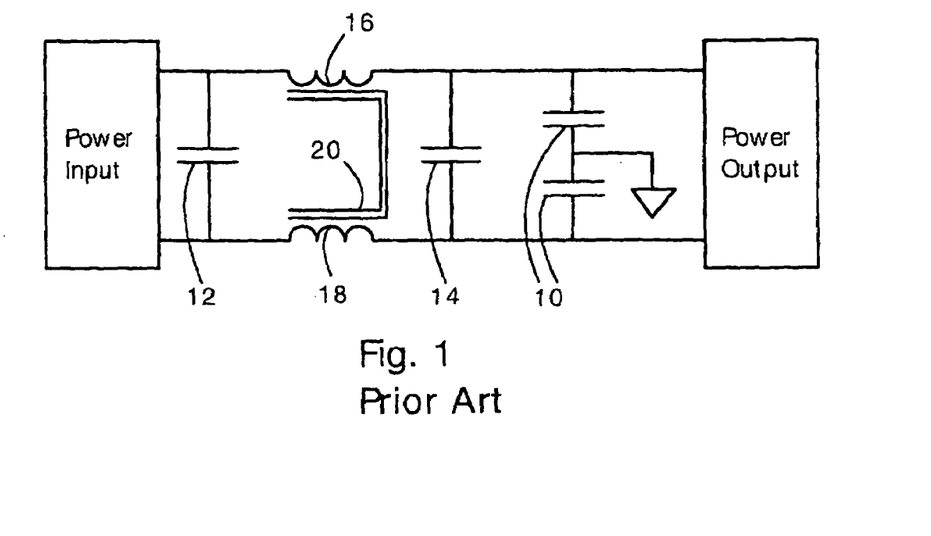
FIG. 1 (Prior Art) shows a conventional single stage EMI filter according to the prior art.

FIG. 1 shows a typical conventional EMI filter circuit. The filter has common-mode capacitors 10 that attenuate common-mode noise. First capacitor 12 and second capacitor 14 are connected in parallel on either side of coupled inductors 16 18. The coupled inductors 16 18 are coupled by a toroidal ferrite core 20. The power input can provide DC power, or 120 volt 60 hz conventional line power, for example. The power output can be connected to a computer, telecommunications device or any other electronic equipment.

In a conventional application, coupled inductance offers common mode attenuation and the leakage inductance offers differential mode attenuation.

Figure 2:
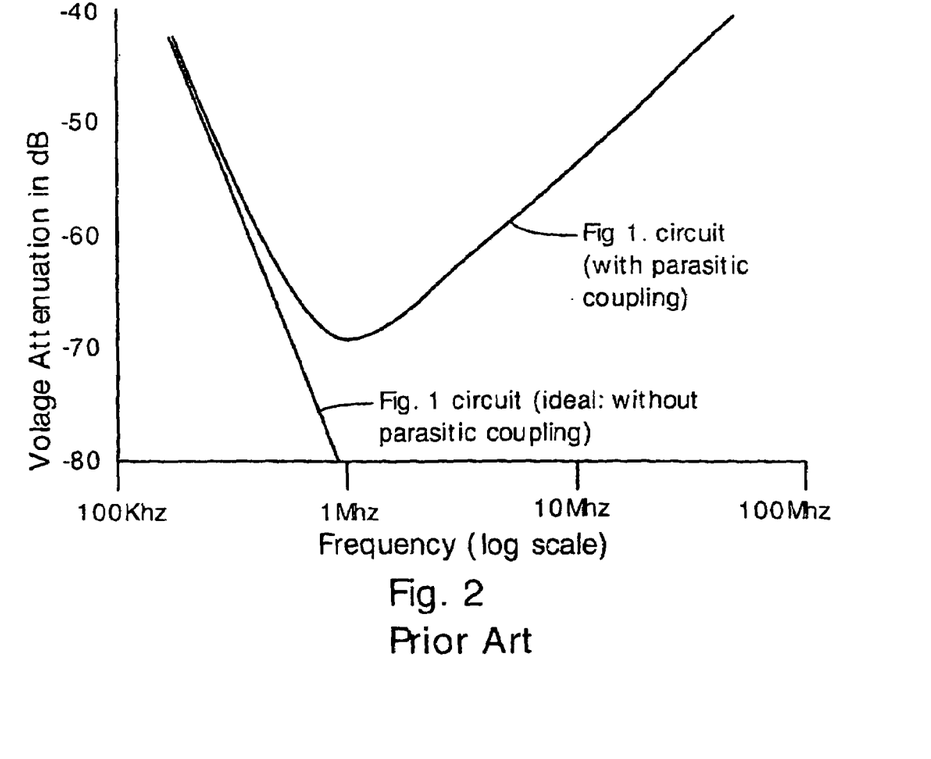
FIG. 2 (Prior Art) shows a plot of EMI filter performance versus frequency for an ideal filter with no parasitic inductive couplings, and for an EMI filter having parasitic inductive couplings.

A problem with the circuit of FIG. 1 is that the attenuation of the filter decreases with increasing frequency. This degradation in filter performance occurs because of parasitic inductive coupling (i.e., mutual inductance) between filter components. The parasitic inductive couplings allow high frequency signals (e.g., above about 1 Mhz) to jump between components and appear at the filter output. FIG. 2, for example, show plots of insertion voltage attenuation in dB versus frequency for an ideal circuit without parasitic inductive couplings, and for a real circuit. The parasitic inductive couplings cause an enormous degradation in filter performance that increases with increasing frequency.

With modern electronics operating at ever-increasing speeds and ever-decreasing voltages, it is becoming more difficult to protect sensitive circuits from damaging and disruptive electrical noise. Consequently, EMI filters must be improved to provide increased attenuation of electrical noise, particularly at high frequencies.

It would be an advance in the art to provide an EMI filter having increased attenuation at high frequencies. Such an EMI filter could be widely used in protecting sensitive electronic circuits operating at high frequencies and low voltages.

Additionally, it would be an advance in the art of frequency filtering (e.g. high or low pass filtering, band pass filtering or band reject filtering) to provide filters having an improved response at high frequencies.

SUMMARY OF THE INVENTION

The present invention includes a filter circuit with reduced mutual inductance between capacitors. The filter has a first capacitor, a second capacitor, and a first inductor. The capacitors are connected to opposite ends of the inductor. Input signals can be applied across either the first capacitor or second capacitor. In the present invention, an inductance cancellation loop is connected to the first capacitor. The loop is oriented so that current in the loop travels in a direction opposite from current traveling through the capacitor. Therefore, the loop tends to reduce the inductance of the first capacitor and reduce the mutual inductance between the first capacitor and other components. The loop is connected to the capacitor so that it is in series with the capacitor in a high frequency circuit model (i.e., when inductors can be modeled as open circuits with infinite impedance).

The inductance cancellation loop can be a wire or metal strip disposed on the first capacitor.

A second inductor can be provided coupled to the first inductor. Both inductors can be oriented horizontally with respect to a circuit board so that inductive coupling between the inductors and circuit board traces is reduced.

The first and second capacitors can be physically oriented in parallel.

The first capacitor and second capacitor have a mutual inductance Mc, and the inductance cancellation loop and second capacitor have a mutual inductance Ma. In the present invention, Mc and Ma are preferably equal to within, for example, 25% or 15%.

The present invention also includes an embodiment having a third capacitor and third inductor connected to form a two-stage filter. A fourth inductor coupled to the third inductor can also be present.

The present filter circuit can be an EMI filter, a band pass filter, a low pass filter, or a band reject filter. All these filters will have high attenuation of unwanted high frequency signals.

The present invention also includes filters in which the inductance cancellation loop is not present, but the inductors are oriented horizontally with respect to circuit board traces.

The inductors can be coupled by, for example, a toroidal magnetic core (e.g. made of ferrite).

In the present invention, the combination of inductance cancellation loop and horizontally oriented inductors provides exceptionally high attenuation of high frequency signals.

DETAILED DESCRIPTION OF THE PREFERRED EMBODIMENTS OF THE INVENTION

The present invention provides electromagnetic interference (EMI) filters and frequency filters (e.g., high or low pass filtering, band pass or band reject filtering) having a capacitor with an inductive cancellation loop. The inductive cancellation loop is connected to the capacitor and provides a current flow that is anti-parallel to current flowing in the capacitor. The loop greatly reduces the mutual inductance between the capacitor and other filter components. Preferably, the inductive cancellation loop is in close proximity to the capacitor (e.g., the loop can be disposed on the capacitor). With the present inductive cancellation loop, the EMI filter has a much greater attenuation at high frequencies. Also, the present invention includes filters with inductors oriented horizontally with respect to a circuit board or circuit board traces. Horizontal orientation reduces coupling between leakage inductance and circuit board traces and between leakage inductance and capacitors.

Figure 3:
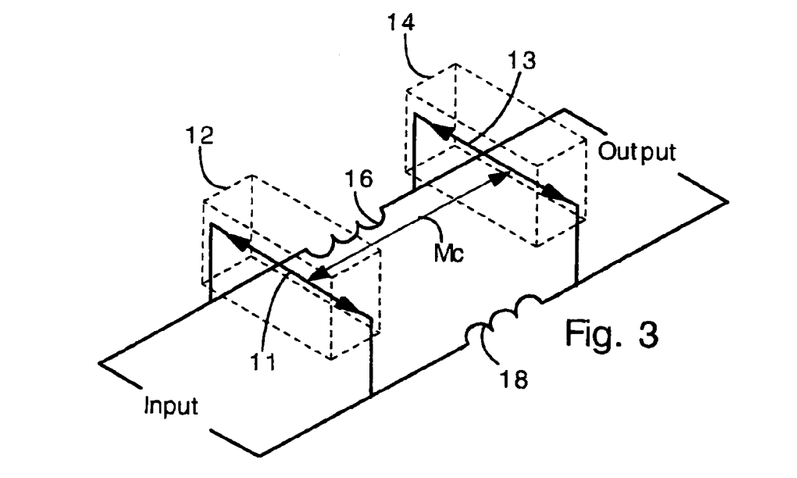
FIG. 3 illustrates inductive coupling between capacitors in the circuit of FIG. 2, as discovered by the present inventors.

In order to more fully describe the effects of coupled inductances in an EMI filter as discovered by the present inventors, FIG. 3 shows a typical physical layout of the capacitors 12 14 of the circuit of FIG. 1 (and the new understanding as deduced by the inventors). The capacitors 12 14 are spaced apart and oriented in parallel. Inductors 16 18 are illustrated, but the toroidal ferrite core 20 (normally located between the capacitors 12 14) is not shown for brevity. The capacitors 12 14 are essentially parallel conductors, and so have a mutual inductance Mc. The mutual inductance Mc is modeled by the inductive coupling between two parallel virtual conductors 11 13 extending through the centers of the capacitors. When high frequency signals flow into the first capacitor 12 or second capacitor 14, the signals are inductively coupled by the mutual inductance Mc to the other capacitors. The high frequency signals thereby propagate through the filter, resulting in lowered high frequency attenuation.

The present inventors have discovered that in order to increase the attenuation of high frequency noise by the filter, the mutual inductance Mc between the capacitors must be cancelled or reduced.

Figure 4:
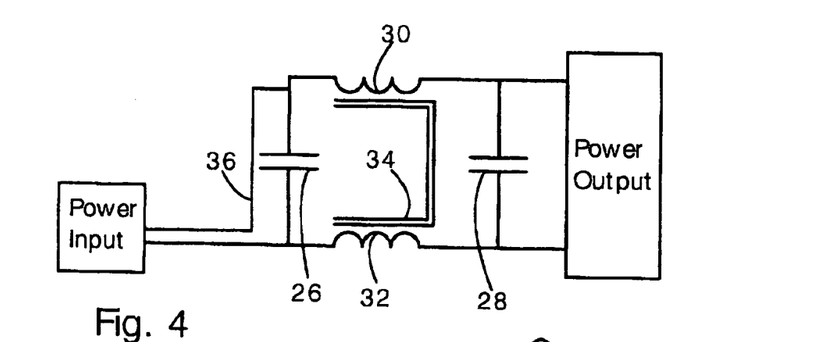
FIG. 4 shows a circuit diagram of an EMI filter according to the present invention.

FIG. 4 illustrates the present EMI filter. The present EMI filter has a first capacitor 26 and a second capacitor 28. The first capacitor 26 and second capacitor 28 are connected in parallel on opposite ends of first inductor 30 and second inductor 32. The first inductor 30 and second inductor 32 are preferably coupled by a toroidal ferrite magnetic core 34.

Figure 5:
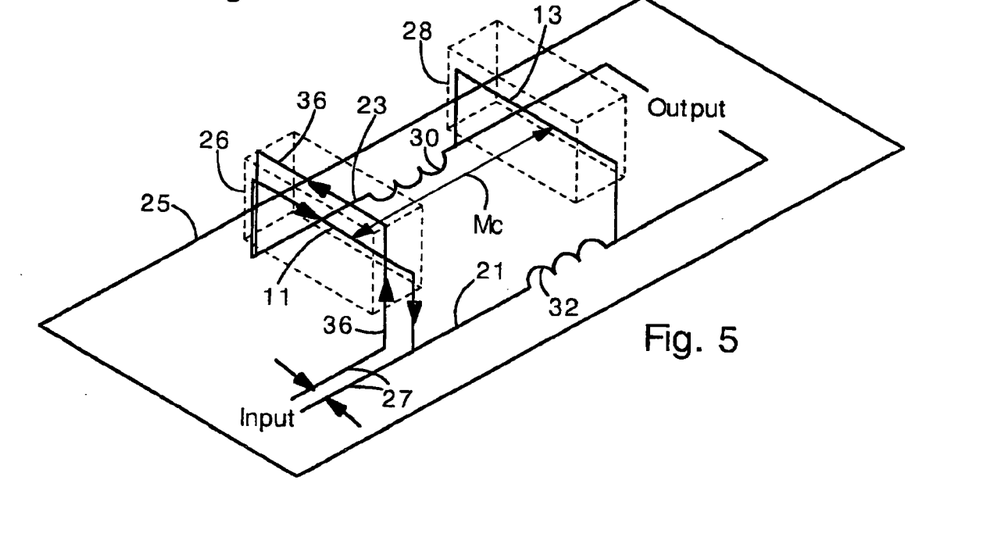
FIG. 5 shows a perspective view of an EMI filter according to the present invention. The EMI filter has an inductance cancellation loop 36.

FIG. 5 shows a perspective view of the filter according to the present invention. The toroidal core 34 is not shown. The capacitors 26 28 are spaced apart and preferably oriented in parallel (because parallel orientation provides a small physical size); the capacitors comprise parallel conductors. The capacitors 26 28 and inductors 30 32 are connected by circuit board traces 21 23. The capacitors 26 28 and traces 21 23 can be disposed on a circuit board 25.

Common-mode capacitors (e.g., capacitors 10 of FIG. 1) for attenuating common-mode noise are not shown, but may be included.

The capacitors 26 28 can be wound foil capacitors, ceramic chip capacitors or any other kind of capacitor. Preferably, the capacitors 26 28 have a dielectric material capable of responding to high frequency signals. The circuit is preferably symmetrical so first and second capacitors 26 28 may be interchangeable. First and second capacitors 26 28 may be identical.

Significantly, in the present invention, the first capacitor 26 has an associated inductance cancellation loop 36. The inductance cancellation loop 36 is necessarily connected the first capacitor 26. Also, the inductance cancellation loop 36 is necessarily oriented so that current flowing through the cancellation loop 36 flows in a direction opposite to current flowing in the first capacitor 26 (i.e., flowing through virtual conductor 11). Hence, the inductance cancellation loop 36 reduces the inductance of the first capacitor, and reduces the mutual inductance Mc between the first capacitor 26 and second capacitor 28.

It is important to note that the loop 36 is connected in series with the capacitor 26 for high frequency signals. The first inductor represents a very high impedance (approximated as infinite) to high frequency signals. So, for high frequency signals, the loop 36 is considered to be connected in series with the capacitor.

Of course, since the circuit is symmetrical, and capacitors 26 28 are interchangeable, the inductance cancellation loop 36 can be connected to the second capacitor 28 instead of the first capacitor 26.

The inductance cancellation loop 36 can comprise a wire, or a strip of copper foil disposed on (e.g., adhered to) the first capacitor 26.

It is noted that the circuit board traces 27 adjacent to the loop 36 should be close together so that they are not inductively coupled to other components.

In a specific experiment performed by the present inventors, the inductance cancellation loop 36 was added to an EMI filter in which first and second capacitors are 0.47 µF foil wound capacitors spaced apart by 2.2 centimeters. The loop 36 was made from a strip of adhesive-backed copper foil. In this specific case, the mutual inductance Mc between the capacitors was reduced from 249 picoHenries to 19 picoHenries, about 92%. The equivalent series inductance of the first capacitor was reduced from 12 nanoHenries to 4 nanoHenries by the loop.

Figure 6:
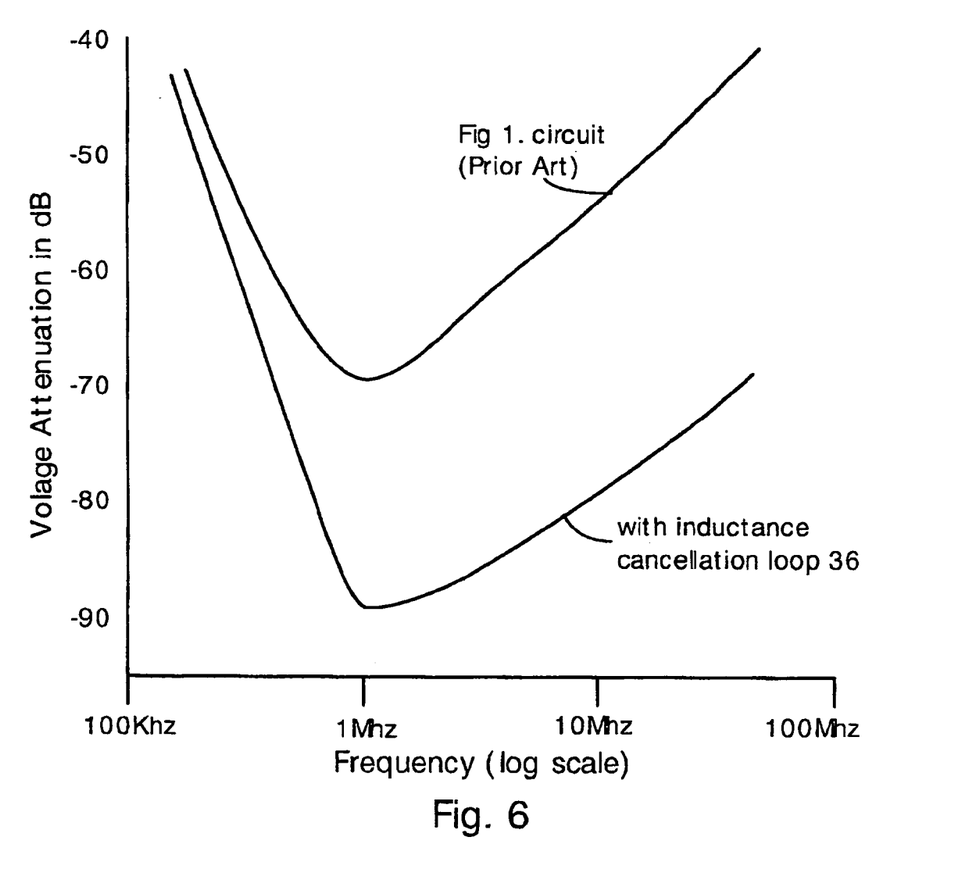
FIG. 6 illustrates the superior performance of the present EMI filter compared to the filter of the prior art.

FIG. 6 shows a plot of attenuation versus frequency for a conventional EMI filter (e.g., the filter of FIG. 1) and the present EMI filter with the inductive cancellation loop 36. The attenuation at high frequencies is greatly increased as a result of the reduction in mutual inductance Mc between the capacitors 26 28. At frequencies of several Mhz, the present inductive cancellation loop 36 increases the attenuation by about 20 dB, a surprising and dramatic increase.

Figure 7A:
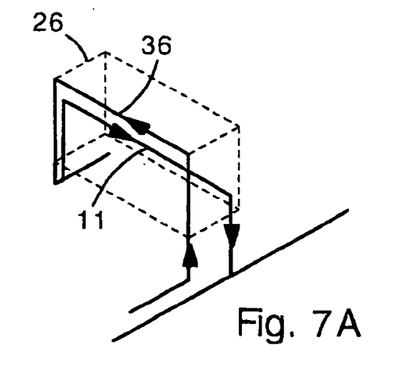
FIGS. 7A–7L illustrate various embodiments of the inductance cancellation loop according to the invention.

The present inductive cancellation loop 36 can have many different forms and shapes, and can be located in different places on or in the capacitor 26. FIGS. 7A–7L show the first capacitor 26 and loop 36 in isolation, illustrating several different embodiments of the inductance cancellation loop 36. FIGS. 7A–7L are described below:

FIG. 7A: The inductance cancellation loop 36 is disposed on a rear (the side opposite the second capacitor 28) side of the capacitor 26. The loop 36 extends down a rear side corner of the capacitor.26. The loop 36 extends across a top surface of the capacitor 26.

Figure 7B:
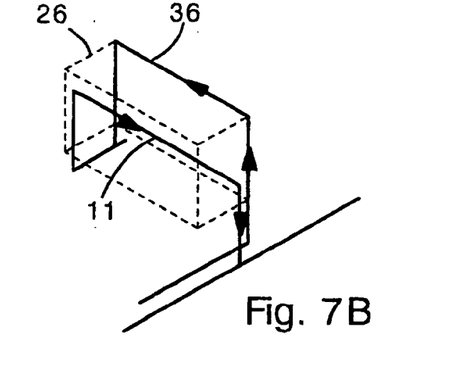

FIG. 7B: The inductance cancellation loop 36 is disposed on a front (the side closest to the second capacitor 28) corner of the capacitor. The loop extends down a front side corner of the capacitor 26. The loop 36 extends across a top surface of the capacitor 26.

Figure 7C:
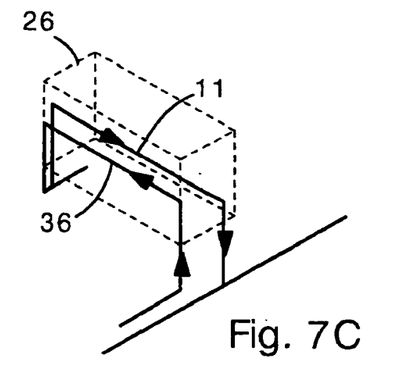

FIG. 7C: The loop 36 extends across a rear surface (farthest from the second capacitor 28) of the capacitor 26.

Figure 7D:
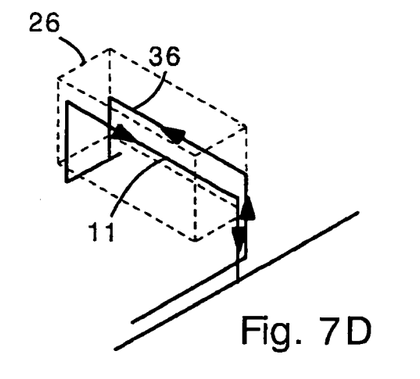

FIG. 7D: The loop 36 extends across a front surface (closest to the second capacitor 28) of the capacitor 26.

Figure 7E:
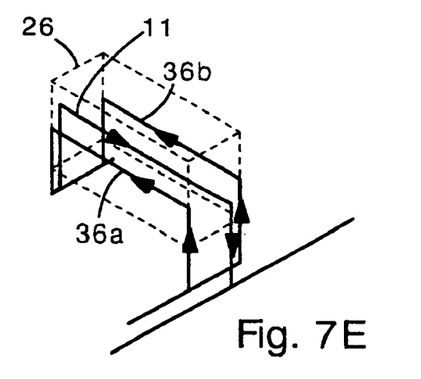

FIG. 7E: The inductance cancellation loop comprises two loops 36a 36b. One loop 36a is disposed on the rear surface, and one loop 36b is disposed on the front surface.

Figure 7F:
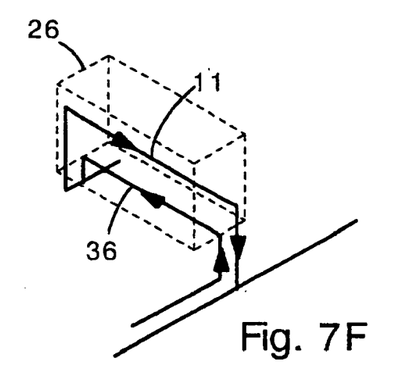

FIG. 7F: The loop 36 is disposed on a bottom surface of the capacitor 26.

Figure 7G:
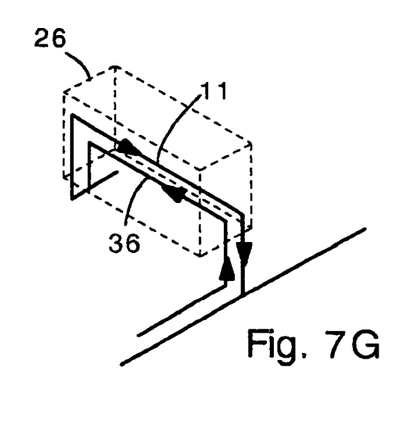

FIG. 7G: The loop 36 extends through the interior of the capacitor. In this embodiment, a hole may be provided in the capacitor to accommodate the loop 36. Reference can be made to U.S. Pat. No. 5,910,879 for details on how to construct a capacitor with a hole, and the complete contents thereof is herein incorporated by reference.

Figure 7H:
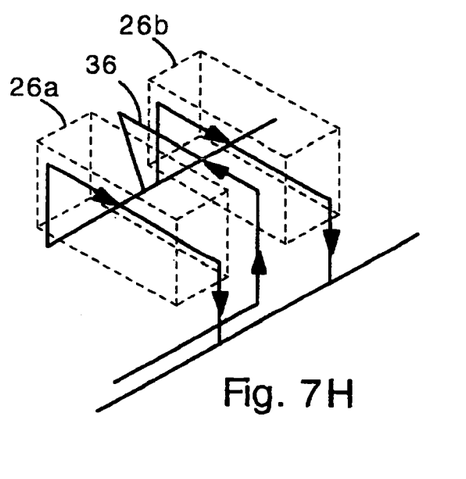

FIG. 7H: The capacitor 26 comprises two separate capacitors: capacitor 26a and capacitor 26b. The capacitors 26a 26b are connected in parallel. Loop 36 is disposed between capacitors 26a 26b.

Figure 7I:
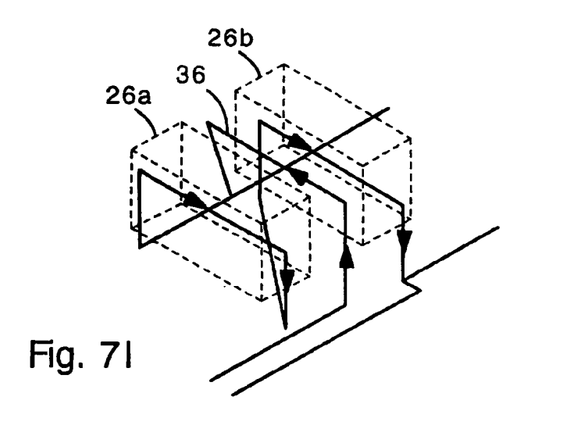

FIG. 7I: The capacitor 26 comprises two separate capacitors: capacitor 26a and capacitor 26b. The capacitors 26a 26b are connected in series. Loop 36 is disposed between capacitors 26a 26b.

Figure 7J:
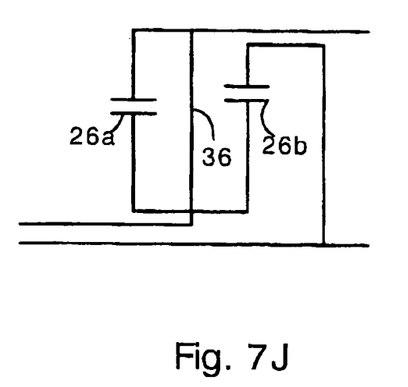

FIG. 7J shows a circuit diagram for the embodiment of FIG. 7H.

Figure 7K:
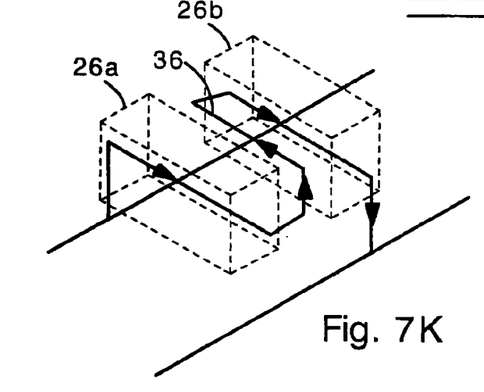

FIG. 7K: The capacitor 26 comprises two separate capacitors: capacitor 26a and capacitor 26b. The capacitors 26a 26b and loop 36 are connected in series. Loop 36 is disposed between capacitors 26a 26b.

Figure 7L:
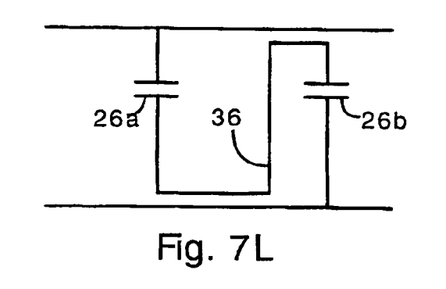

FIG. 7L shows a circuit diagram for the embodiment of FIG. 7K.

In the practice of this invention, the loop may positioned on the capacitor or within 5 to 10 millimiters of the surface of the capacitor.

In the present invention, the inductance cancellation loop 36 is preferably designed to cancel the mutual inductance Mc between the capacitors. The cancellation of the mutual inductance Mc should be as complete as possible. The best design and placement of the inductance cancellation loop 36 can be found empirically by measuring the mutual inductance between the capacitors 26 28.

Figure 8:
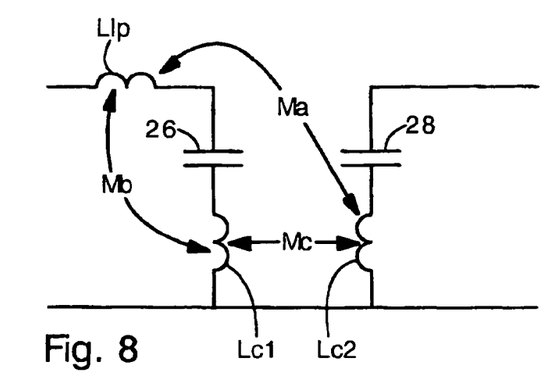
FIG. 8 shows a high frequency model of the present EMI filter, illustrating the most important mutual inductances, Ma, Mb, and Mc.

FIG. 8 shows a high frequency model of the present EMI filter. The inductors 30 32 are not illustrated because they have very high impedance (assumed to be infinite) in the high frequency regime. In the high frequency model, the inductors are approximated by open circuits. The loop 36 (illustrated as inductance Llp) is necessarily connected in series with the capacitor 26 in the high frequency model. High frequency models are well known in the art.

In FIG. 8, Lc1 and Lc2 are the equivalent series inductances (ESL) of first capacitor 26 and second capacitor 28, respectively. Llp is the inductance of the inductance cancellation loop 36. Mc is the mutual inductance between the capacitors 26 28. Ma is the mutual inductance between the loop 36 and second capacitor 28; Mb is the mutual inductance between the loop 36 and the first capacitor 26. In the present invention, the mutual inductance between the capacitors is minimized, and the EMI filter has a maximum attenuation when Mc and Ma are equal and opposite (i.e., when Mc+Ma=0). Therefore, the present EMI filter should be designed so that Mc and Ma are as close as possible in magnitude. The mutual inductances Mc Ma can match to within 25% or 15% or 10% for example (e.g., with 25% or less).

Also, it is preferred for the mutual inductance Mb to be as close as possible to the value of Lc1 (the equivalent series inductance of the first capacitor). The equivalent series inductance of the first capacitor 26 will be approximately equal to the quantity Mb−Lc1. hence, a close match between Mb and Lci will provide a large reduction in the ESL of the first capacitor 26.

In the present invention, it is preferred to have only a single inductance cancellation loop 36. In other words, it is generally not desired (though it is within the scope of the invention and appended claims) to have cancellation loops on both capacitors 26 28. This is because only a single inductance cancellation loop 36 is needed to completely cancel the mutual inductance Mc.

Figure 9:
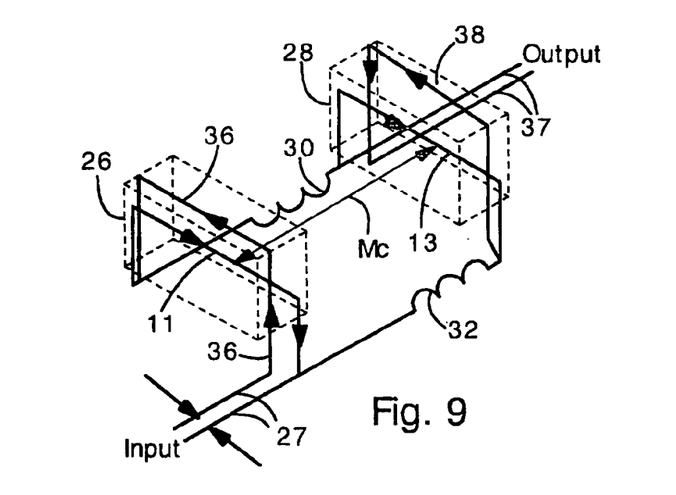
FIG. 9 shows an alternative embodiment of the present EMI filter in which both capacitors of the filter have associated inductance cancellation loops 36 38.
Figure 10:
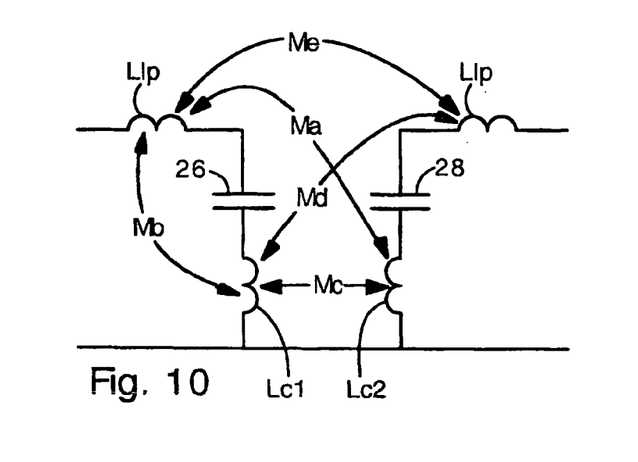
FIG. 10 shows a high frequency model of the EMI filter having two loops 36 38.

FIG. 9 illustrates an embodiment in the invention where both capacitors 26 28 have associated inductance cancellation loops 36 38. In this embodiment, two additional mutual inductances are created that must be cancelled: Md, the mutual inductance between the first capacitor and loop 38, and Me, the mutual inductance between the loops 36 and 38. These mutual inductances are illustrated in FIG. 10 (a high frequency model diagram). In order to provide maximum attenuation at high frequency, all these mutual inductances must cancel so that Ma+Mc+Md+Me=0. While it is possible to design the loops and capacitors to achieve this cancellation (and such embodiments are within the scope of the present invention and appended claims), it is generally more difficult and complex to do. For example, mutual inductance Me might create a new inductive coupling that is not cancelled. Hence, one loop 36 is preferred because two inductance cancellation loops 36 38 can make it more difficult to cancel all the mutual inductances between the capacitors 26 28 and loops 36 38.

Also, it is noted that if two loops 36 38 are employed, it is particularly important for the circuit board traces 27 and circuit board traces 37 (adjacent to the loops 36 38) to be close together, as illustrated in FIG. 9.

Figure 11:
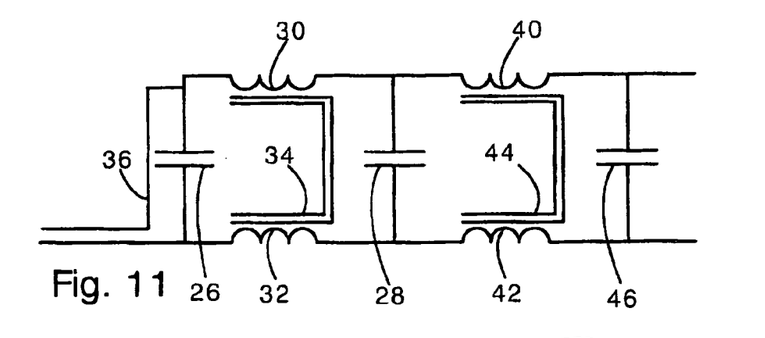
FIG. 11 shows a two-stage filter according to the present invention. Preferably, in the two-stage embodiment, only one of the three capacitors has an inductance cancellation loop.

FIG. 11 shows a two-stage EMI filter according to the present invention. The two stage EMI filter has a third capacitor 46, and a third inductor 40 connected between the second capacitor 28 and third capacitor 46. Also present are a fourth inductor 42, and a toroidal magnetic core 44 coupling the third and fourth inductors 40 42. The capacitors 26 28 46 can be identical. Also, the inductors 30 32 40 42 can be identical.

In the two-stage embodiment of FIG. 11, either the first capacitor 26 or third capacitor 46 should have the inductance cancellation loop 36. The second capacitor 28 preferably does not have an associated inductance cancellation loop. Also preferably, the first capacitor 26 and third capacitor 46 do not both have inductance cancellation loops. This is because multiple cancellation loops create many more mutual inductances that must be cancelled for optimum performance, as noted above in reference to FIGS. 9 and 10. However, it is well within the scope of the invention and dependent claims for both the second capacitor 28 and/or the third capacitor 46 to have inductance cancellation loops. Though it may not provide optimal filter performance, multiple inductance cancellation loops will provide significant improvement over prior art filters that do not have inductance cancellation loops.

Figure 12:
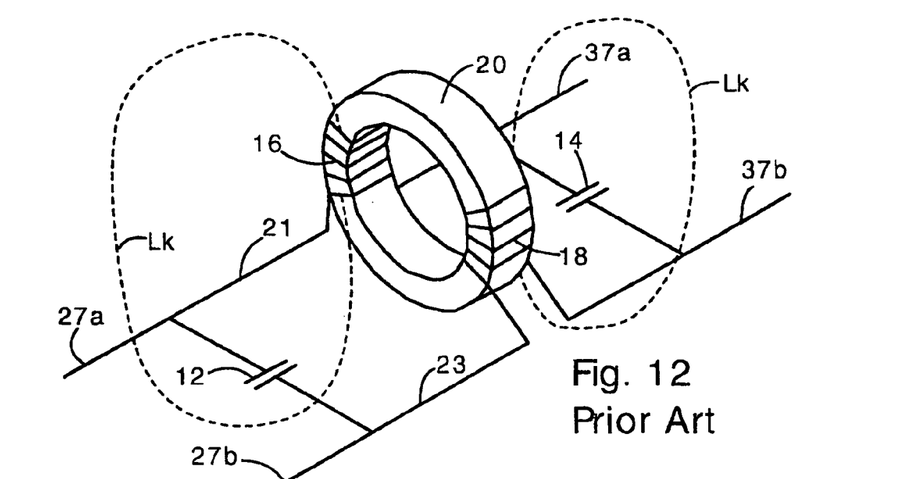
FIG. 12. (Prior Art) shows a prior art filter, illustrating inductive coupling problems caused by the leakage inductance field Lk.

FIG. 12 illustrates another deficiency of prior art EMI filters discovered by the present inventors. In typical prior art EMI filters, the inductors 16 18 are disposed vertically (i.e. "vertically" means an inductor axis extends in a direction perpendicular to the plane defined by the circuit board traces 21 23, 27a, 27b, 37a, 37b). As a result of the vertical orientation, leakage inductance field Lk from the inductors 16 18 cuts across circuit board traces 27a 27b 37a 37b and capacitors 12 14. The leakage inductance field Lk therefore is coupled to both capacitors 12 14, which allows high frequency components to traverse the filter. Hence, the vertical orientation of the inductors 16 18 results in reduced attenuation of high frequency signals.

It is noted that the traces 21 23 are in series with the inductors 16 18 and so are effectively part of the inductor. Coupling between the leakage inductance field Lk and the traces 21 23 does not create propagation paths for the high frequency signals.

Figure 13:
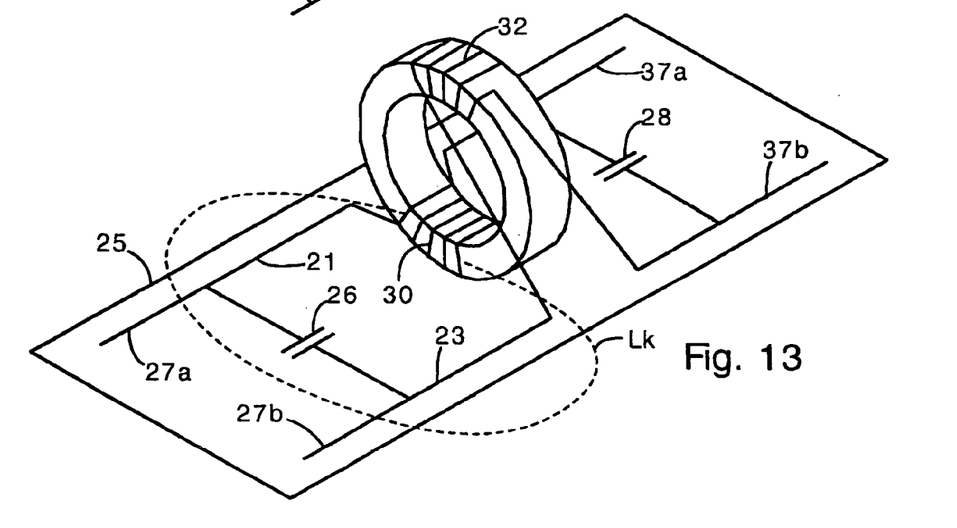
FIG. 13 shows an embodiment of the present invention in which inductors are horizontal (i.e. parallel with circuit board 25) so that inductive coupling between the leakage inductance field Lk and capacitors is minimized.

FIG. 13 illustrates an embodiment of the present invention that solves the problem of leakage inductance coupling illustrated in FIG. 12. In the present invention, the inductors 30 32 are oriented horizontally (i.e. "horizontally" means in the plane of the circuit board 25 or circuit board traces 21 23). As a result of the horizontal orientation, the leakage inductance fields Lk do not cut across the circuitboard traces 27a 27b 37a 37b or cut across the capacitors 26 28. Hence, the horizontal inductor orientation of the present invention prevents high frequency signals from propagating across the filter by means of the leakage inductance field Lk. Consequently, the attenuation of high frequency signals is increased by the horizontal orientation.

Figure 14:
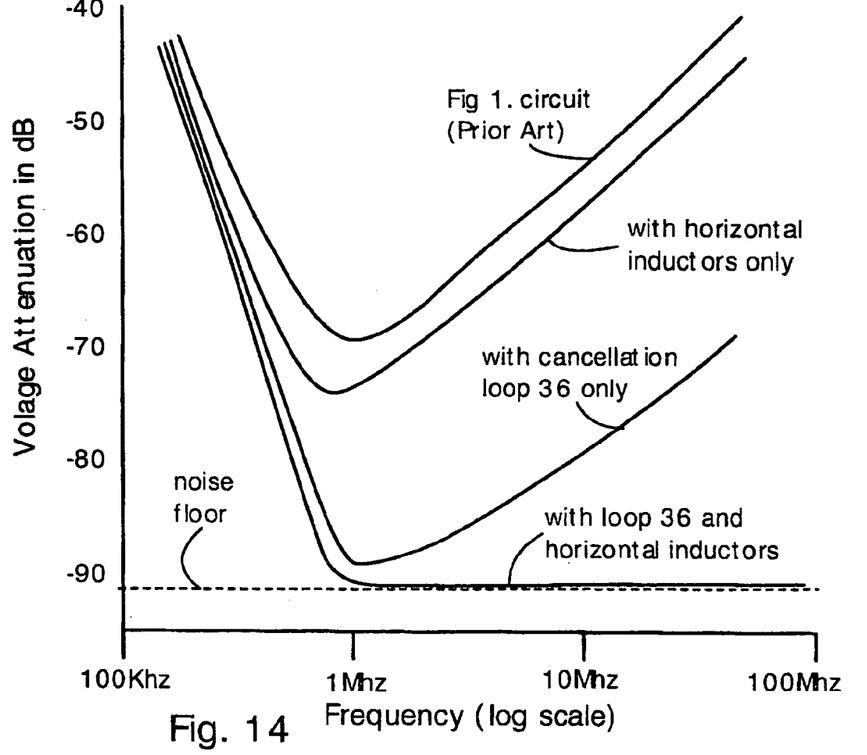
FIG. 14 show plots of attenuation versus frequency, illustrating the effect of horizontal orientation of the inductors.

FIG. 14 shows plots of attenuation versus frequency illustrating the beneficial effect of horizontal inductor orientation. The horizontal inductor alone (without the inductance cancellation loop 36) provides an improvement in attenuation of about 5–10 dB compared to the prior art (i.e. a circuit with vertical inductors) over the high frequency range. When both the inductance cancellation loop 36 and horizontal inductors are present in the same filter, the attenuation becomes extremely high over the entire high frequency range (1–30 Mhz). In the experiments used to generate the plots of FIG. 14, −90 dB was the highest possible attenuation measurement because of the noise floor of the measurement apparatus. The attenuation of the present filter may in fact be higher than −90 dB, but noise in the measurement apparatus did not permit a higher measurement. Hence the attenuation of the present EMI filter likely exceeded the measurement capability of the experimental apparatus.

The present invention is also applicable to frequency filters such as low pass filters, band rejects filters and band pass filters. The present frequency filters provide exceptional attenuation of undesired frequencies as a result of reduced inductive coupling between components.

Figure 15:
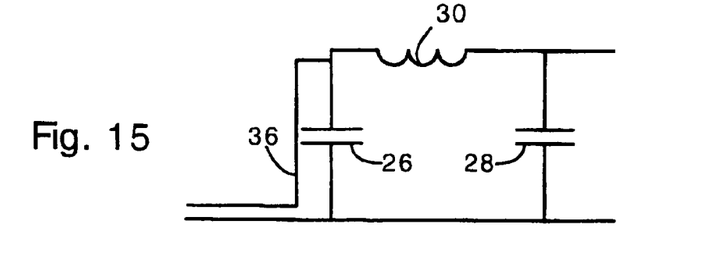
FIG. 15 shows a low pass filter according to the present invention.

FIG. 15, for example, shows a low pass filter according to the present invention. The filter has the first inductor 30, and the second inductor is not present. The inductance cancellation loop 36 is connected to the first capacitor 26. The low pass filter of FIG. 15 provides very high attenuation of undesired high frequency components as a result of the reduced inductive coupling between the capacitors 26 28. Alternatively, the loop 36 is connected to the second capacitor 28.

Figure 16A:
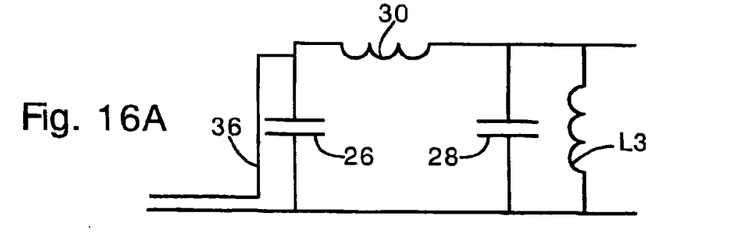
FIGS. 16A–16C show band pass filters according to the present invention.

FIG. 16A shows a band pass filter according to the present invention. An inductor L3 is connected in parallel with the second capacitor. Alternatively, the loop 36 is connected to the second capacitor.

Figure 16B:
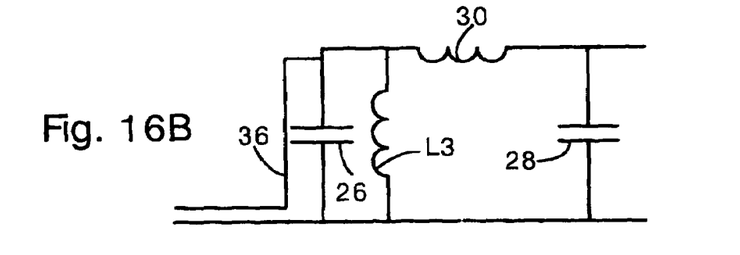

FIG. 16B shows an alternative band pass filter according to the present invention in which the inductor L3 is connected in parallel with the first capacitor 26.

Figure 16C:
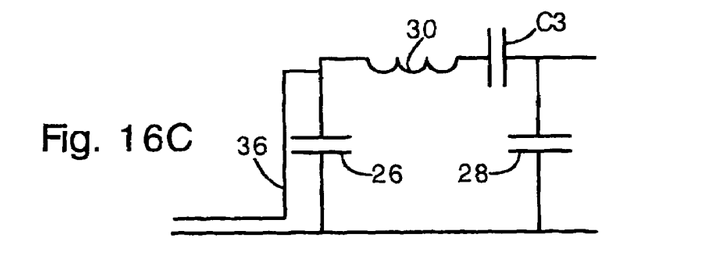

FIG. 16C shows a band pass filter according to the present invention in which a capacitor C3 is connected in series with the first inductor 30. Alternatively, the loop 36 is connected to the second capacitor 28.

Figure 17A:
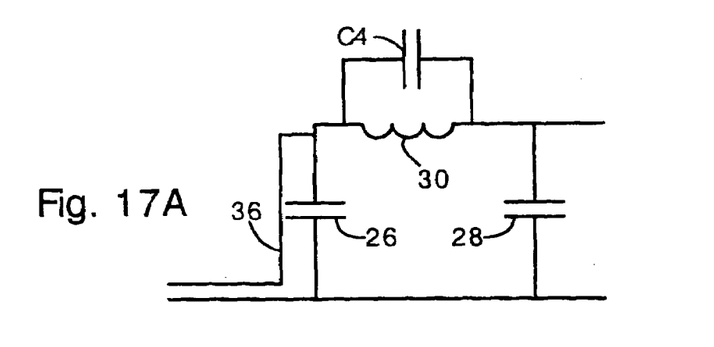
FIGS. 17A–17C show band reject filters according to the present invention.

FIG. 17A shows a band reject filter according to the present invention in which a capacitor C4 is connected in parallel with the inductor 30. Alternatively, the loop 36 is connected to the second capacitor 28.

Figure 17B:
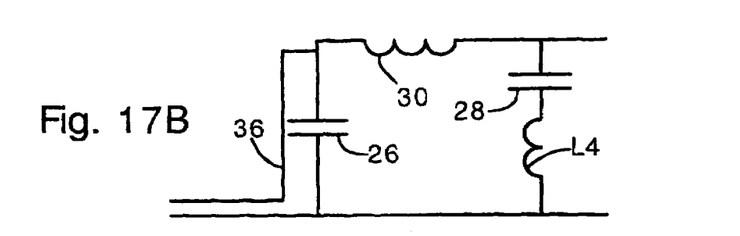

FIG. 17B shows a band reject filter according to the present invention in which an inductor L4 is connected in series with the second capacitor 28. Alternatively, the loop 36 is connected to the second capacitor 28.

Figure 17C:
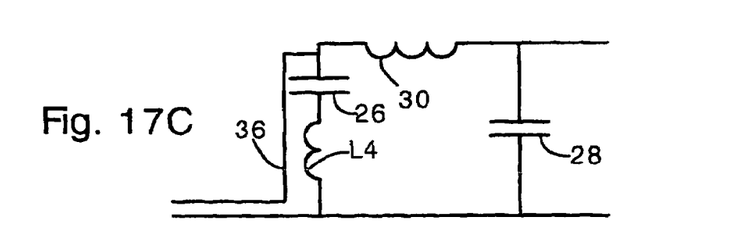

FIG. 17C shows a band reject filter according to the present invention in which the inductor L4 is connected in series with the first capacitor 26. Alternatively, the loop 36 is connected to the second capacitor 28.

It is important to note that, in the circuits of FIGS. 15, 16A, 16B, 16C, 17A, 17B, and 17C, the loop 36 can be connected to either the first and second capacitors 26 28.

Also it is noted that, in any of the circuits of FIGS. 15–17C, the inductors can be disposed horizontally with respect to the circuit board so that coupling to the leakage inductance field is reduced.

The filters of FIGS. 15–17 will provide enhanced performance, particularly in the high frequency range (above about 1 Mhz). Attenuation of undesired high frequency signals will be increased compared to circuits lacking the inductance cancellation loop 36 or circuits having vertically oriented inductors.

The present invention provides electromagnetic interference filters and frequency filters with exceptionally high attenuation of undesired high frequencies. The combination of the inductance cancellation loop 36 and horizontal inductor orientation can boost attenuation by 30 dB. Hence, the filters of the present invention are well suited for use in protecting sensitive high speed and low voltage electronics of electrical noise.

It will be clear to one skilled in the art that the above embodiment may be altered in many ways without departing from the scope of the invention. Accordingly, the scope of the invention should be determined by the following claims and their legal equivalents.

What is claimed is:

1. A filter circuit with reduced mutual inductance between capacitors, comprising:
   a) a first capacitor;
   b) a second capacitor;
   c) an first inductor, wherein the first capacitor and second capacitor are connected to opposite ends of the inductor, wherein there is a mutual inductance between said first and second capacitors and their connection to said first inductor; and
   d) a mutual inductance cancellation loop connected to the first or second capacitor, wherein the loop is oriented such that it conducts current in a direction opposite the direction of current within the first or second capacitor, whereby the filter circuit filters signals which are applied across the first capacitor or applied across the second capacitor, and wherein the mutual inductance cancellation loop is connected in series with the first or second capacitor in a high frequency model of the filter circuit.

2. The filter circuit of claim 1 further comprising a second inductor connected between the first and second capacitors, wherein the second inductor is coupled to the first inductor.

3. The filter circuit of claim 2 wherein the first inductor and second inductor are disposed on a toroidal magnetic core, and wherein the first inductor and second inductor are oriented horizontally on the toroidal magnetic core.

4. The filter circuit of claim 2 wherein the first capacitor and second capacitor are positioned on a circuit board, and wherein the first and second inductors are oriented horizontally with respect to the circuit board.

5. The filter circuit of claim 1 wherein the first capacitor and second capacitor are spaced apart and oriented in parallel.

6. The filter circuit of claim 1, wherein the first capacitor and second capacitor have a mutual mutual inductance Mc, and wherein the inductance cancellation loop and second capacitor have a mutual inductance Ma, and wherein Mc and Ma are equal to within 25%.

7. The filter circuit of claim 1, wherein the first capacitor and second capacitor have a mutual mutual inductance Mc, and wherein the inductance cancellation loop and second capacitor have a mutual inductance Ma, and wherein Mc and Ma are equal to within 15%.

8. The filter circuit of claim 2 further comprising:
   e) a third capacitor;
   f) a third inductor connected between the second capacitor and third capacitor,
whereby the filter circuit comprises a two-stage filter.

9. The filter circuit of claim 8, further comprising a fourth inductor connected between the second capacitor and the third capacitor, and wherein the third inductor and fourth inductor are coupled.

10. The filter circuit of claim 1 wherein the mutual inductance cancellation loop comprises a wire disposed on the first capacitor or second capacitor.

11. The filter circuit of claim 1 further comprising another inductor connected in parallel with the first capacitor or second capacitor, whereby the filter circuit is a band pass filter.

12. The filter circuit of claim 1 further comprising a capacitor connected in series with the inductor, whereby the filter circuit is a band pass filter.

13. The filter circuit of claim 1 further comprising a capacitor connected in parallel with the inductor, whereby the filter circuit is a band reject filter.

14. The filter circuit of claim 1 further comprising another inductor connected in series with the first capacitor or second capacitor, whereby the filter circuit is a band reject filter.

15. A filter circuit with reduced mutual inductance between capacitors, comprising:
   a) a first capacitor disposed on a circuit board;
   b) a second capacitor disposed on the circuit board;
   c) a first inductor, wherein the first capacitor and second capacitor are connected to opposite ends of the first inductor, wherein there is a mutual inductance between said first and second capacitors and their connection to said first inductor wherein the first inductor is disposed horizontally relative to the circuit board;
   d) an inductance cancellation loop connected to the first capacitor or second capacitor, wherein the mutual inductance cancellation loop is oriented such that it conducts current in a direction opposite the direction of current within the first capacitor or second capacitor, whereby the filter circuit filters signals which are applied across the first capacitor or applied across the second capacitor, and wherein the mutual inductance cancellation loop is connected in series with the first capacitor or second capacitor in a high frequency model of the filter circuit.

16. The filter circuit of claim 15 further comprising a second inductor connected between the first capacitor and second capacitor, and wherein the first inductor and second inductor are coupled, and wherein the second inductor is disposed horizontally relative to the circuit board.

17. The filter circuit of claim 15, wherein the first capacitor and second capacitor have a mutual mutual inductance Mc, and wherein the inductance cancellation loop and second capacitor have a mutual inductance Ma, and wherein Mc and Ma are equal to within 15%.

* * * * *